(12) United States Patent
Han et al.

(10) Patent No.: US 10,935,741 B2
(45) Date of Patent: Mar. 2, 2021

(54) OPTICAL MODULE AND SOLDER BALL BONDING STRUCTURE

(71) Applicant: Electronics and Telecommunications Research Institute, Daejeon (KR)

(72) Inventors: Young-Tak Han, Daejeon (KR); Seok-Tae Kim, Daejeon (KR); Jong-Hoi Kim, Daejeon (KR); Sang-Ho Park, Daejeon (KR); Yongsoon Baek, Daejeon (KR); Jang-Uk Shin, Daejeon (KR); Seo-Young Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/572,089

(22) Filed: Sep. 16, 2019

(65) Prior Publication Data

US 2020/0241226 A1 Jul. 30, 2020

(30) Foreign Application Priority Data

Jan. 30, 2019 (KR) .................. 10-2019-0012299

(51) Int. Cl.
*G02B 6/42* (2006.01)
*G02B 6/293* (2006.01)
*H01L 23/00* (2006.01)

(52) U.S. Cl.
CPC ......... *G02B 6/4281* (2013.01); *G02B 6/2938* (2013.01); *G02B 6/4246* (2013.01); *H01L 24/16* (2013.01); *G02B 6/29301* (2013.01); *H01L 2224/16225* (2013.01); *H01L 2924/30111* (2013.01)

(58) Field of Classification Search
CPC .. G02B 6/4281; G02B 6/2938; G02B 6/4246; G02B 6/29301; H01L 24/16; H01L 2224/16225; H01L 2224/30111
USPC .......................................................... 385/14
See application file for complete search history.

(56) References Cited

U.S. PATENT DOCUMENTS 6,862,378 B2 3/2005 Karnacewicz et al.
10,412,828 B1 * 9/2019 Yamakawa ....... H01L 23/49822
(Continued)

OTHER PUBLICATIONS

Shigeru Kanazawa, et al., "30-km Error-Free Transmission of Directly Modulated DFB Laser Array Transmitter Optical Sub-Assembly for 100-Gbit/s Application", IEEE JLT, vol. 34, No. 15, pp. 1-7, Aug. 2016.
(Continued)

*Primary Examiner* — Jerry M Blevins
(74) *Attorney, Agent, or Firm* — Rabin & Berdo, P.C.

(57) ABSTRACT

Provided is an optical module including an optical waveguide device through which multiple channel lightwaves are input and output, an optical transmission/reception unit disposed on one side of the optical waveguide device, an electronic IC disposed on one side of the optical transmission/reception unit and configured to drive the optical transmission/reception unit, a flexible printed circuit board (PCB) disposed on the optical transmission/reception unit and the electronic IC, a first solder ball between the optical transmission/reception unit and the flexible PCB and a second solder ball between the electronic IC and the flexible PCB.

15 Claims, 4 Drawing Sheets

(56) References Cited

U.S. PATENT DOCUMENTS

| | | | |
|---|---|---|---|
| 2005/0201669 A1* | 9/2005 | Welch | G02B 6/12007 385/14 |
| 2008/0285978 A1 | 11/2008 | Choi et al. | |
| 2013/0004120 A1* | 1/2013 | Zbinden | G02B 6/4269 385/14 |
| 2014/0147128 A1 | 5/2014 | Han et al. | |
| 2015/0364816 A1* | 12/2015 | Murugan | H01L 23/66 343/905 |
| 2018/0122777 A1* | 5/2018 | Wong | H01L 29/20 |
| 2019/0285815 A1* | 9/2019 | Sugiyama | H04B 10/40 |

OTHER PUBLICATIONS

Shigeru Kanazawa, et al., "Ultra-Compact 100 GbE Transmitter Optical Sub-Assembly for 40-km SMF Transmission", Journal of Lightwave Technology, vol. 31, No. 4, pp. 602-608, Feb. 15, 2013.

* cited by examiner

OPTICAL MODULE AND SOLDER BALL BONDING STRUCTURE

CROSS-REFERENCE TO RELATED APPLICATIONS

This U.S. non-provisional patent application claims priority under 35 U.S.C. § 119 of Korean Patent Application No. 10-2019-0012299, filed on Jan. 30, 2019, the entire contents of which are hereby incorporated by reference.

BACKGROUND

The present disclosure herein relates to an optical module and a solder ball bonding structure, and more particularly, to an optical module configured to transmit and receive multi-channel lightwave, and a solder ball bonding structure.

As an optical communication technology is advanced, an optical communication module having new functions is being introduced. In particular, an optical module for transmitting and receiving a signal with a data rate of 10 Gbps or higher is required to be designed and manufactured in consideration of loss, reflection, resonance or the like of a high frequency signal with respect to each of module configuration components and the disposition structure thereof. Here, electrical connections between the components may be mainly formed through wire bonding. However, serious impedance mismatching may occur at each electrical connection part due to high inductance between wires, and thus high frequency characteristics of an optical module may be easily deteriorated at the time of a high speed operation. In addition, electrical crosstalk may occur between multiple wires, and thus it is hard to obtain excellent high frequency characteristics when operating at 50 Gbps or higher.

SUMMARY

The present disclosure provides an optical module in which high frequency characteristics are improved and a solder ball bonding structure for the same.

Issues to be addressed in the present disclosure are not limited to those described above and other issues unmentioned above will be clearly understood by those skilled in the art from the following description.

An embodiment of the inventive concept provides an optical module including: an optical waveguide device through which multiple channel lightwaves are input and output; an optical transmission/reception unit disposed on one side of the optical waveguide device; an electronic IC disposed on one side of the optical transmission/reception unit and configured to drive the optical transmission/reception unit; a flexible printed circuit board (PCB) disposed on the optical transmission/reception unit and the electronic IC; a first solder ball disposed between the optical transmission/reception unit and the flexible PCB; and a second solder ball disposed between the electronic IC and the flexible PCB.

In an embodiment, the flexible PCB may include a first signal wiring between the first solder ball and the second solder ball.

In an embodiment, the flexible PCB may further include an air hole vertically overlapping at least one of the first solder ball and the second solder ball.

In an embodiment, the first signal wiring may contact at least one of the first solder ball and the second solder ball, and the air hole may expose at least a part of the first signal wiring.

In an embodiment, the first signal wiring may contact at least one of the first solder ball and the second solder ball, and the optical module may further include a cover pad separated from the first signal wiring and configured to cover the air hole.

In an embodiment, the optical module may further include a ground wiring. The flexible PCB may include an overlap region vertically overlapping the first solder ball and a separation region separated horizontally from the first solder ball. A distance between the first signal wiring in the overlapping region and the ground wiring may be larger than that between the first signal wiring in the separation region and the ground wiring.

In an embodiment, the flexible PCB may include a first layer and a second layer sequentially laminated on the first signal wiring, and the ground wiring may include a first ground wiring disposed on the first layer of the overlap region, a second ground wiring disposed on the second layer in the separation region, and a contact configured to connect the first and second ground wirings.

In an embodiment, the optical module may further include a submount on which the optical transmission/reception unit and the electronic IC are mounted.

In an embodiment, the optical waveguide device may further include a carrier board on which the optical waveguide device and the submount are mounted. the carrier board may include a first region in which the optical waveguide device and the submount are mounted, and a second region in which a signal control unit is comprised which controls high frequency signals output from the optical transmission/reception unit.

In an embodiment, the optical module may further include a third solder ball between the second region and the flexible PCB.

In an embodiment, the flexible PCB may include a second signal wiring between the second solder ball and the third solder ball.

In an embodiment, the optical waveguide device may include: a transmitter arrayed waveguide grating (Tx AWG) configured to multiplex the multiple channel lightwaves and transmit multi-channel lightwaves; and a receiver arrayed waveguide grating (Rx AWG) configured to receive and demultiplex the multi-channel lightwaves.

In an embodiment, the optical waveguide device, the optical transmission/reception unit and the electronic IC may be disposed along a first direction.

In an embodiment, the optical transmission/reception unit may include an optical source device and an optical detection device, wherein the optical source device and the optical detection device are separated in a second direction perpendicular to the first direction.

In an embodiment, the electronic IC may further include: an optical source device driving unit configured to drive the optical source device; and a signal amplification unit configured to amplify an output signal from the optical detection device, wherein the optical source device driving unit and the signal amplification unit are separated in the second direction.

In an embodiment of the inventive concept, a solder ball bonding structure includes: a first device including a first signal wiring and a signal ground unit; a second device including a conductive pad; and a solder ball configured to connect the first signal wiring and the conduction pad, wherein the first device includes an air hole vertically overlapped with the solder ball.

In an embodiment, the first device may further include a cover pad vertically overlapped with the solder ball, and configured to cover the air hole.

In an embodiment, the air hole may expose at least a part of the first signal wiring vertically overlapped with the solder ball.

In an embodiment, a diameter of the air hole may correspond to or is greater than that of the solder ball.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
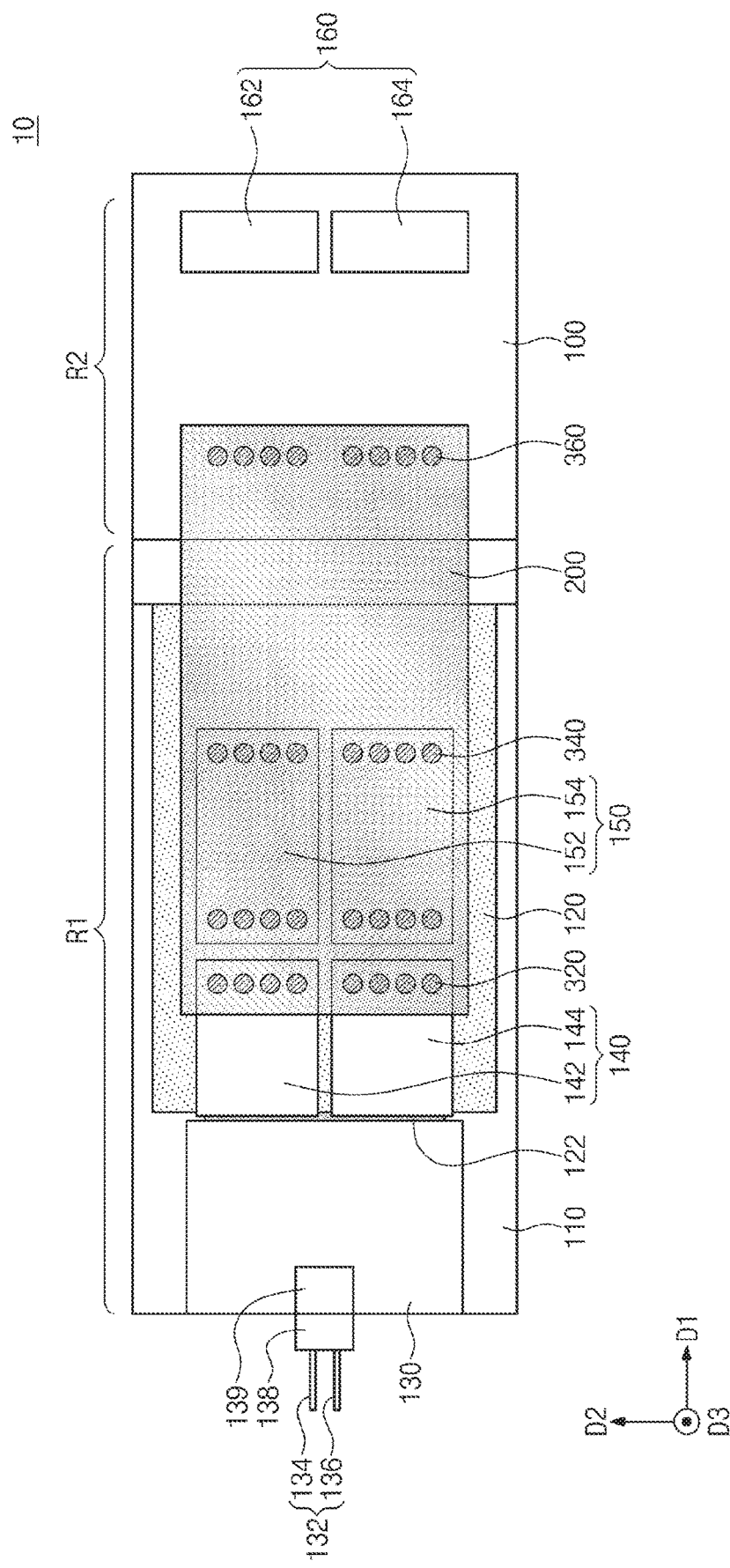
FIG. 1 shows an optical module according to an embodiment of the inventive concept.

Advantages and features of the present invention, and methods for achieving the same will be cleared with reference to exemplary embodiments described later in detail together with the accompanying drawings. However, the present invention is not limited to the following exemplary embodiments, but realized in various forms. In other words, the present exemplary embodiments are provided just to complete disclosure the present invention and make a person having an ordinary skill in the art understand the scope of the invention. The present invention should be defined by only the scope of the accompanying claims. Throughout this specification, like numerals refer to like elements.

The terminology used herein is for the purpose of describing particular embodiments only and is not intended to limit the scope of the present disclosure. As used herein, the singular forms "a", "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Moreover, exemplary embodiments will be described herein with reference to cross-sectional views and/or plane views that are idealized exemplary illustrations. In the drawings, the thickness of layers and regions are exaggerated for effective description of the technical details. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. Thus, the regions illustrated in the figures are schematic in nature and their shapes may be not intended to illustrate the actual shape of a region of a device and are not intended to limit the scope of example embodiments.

Figure 2:
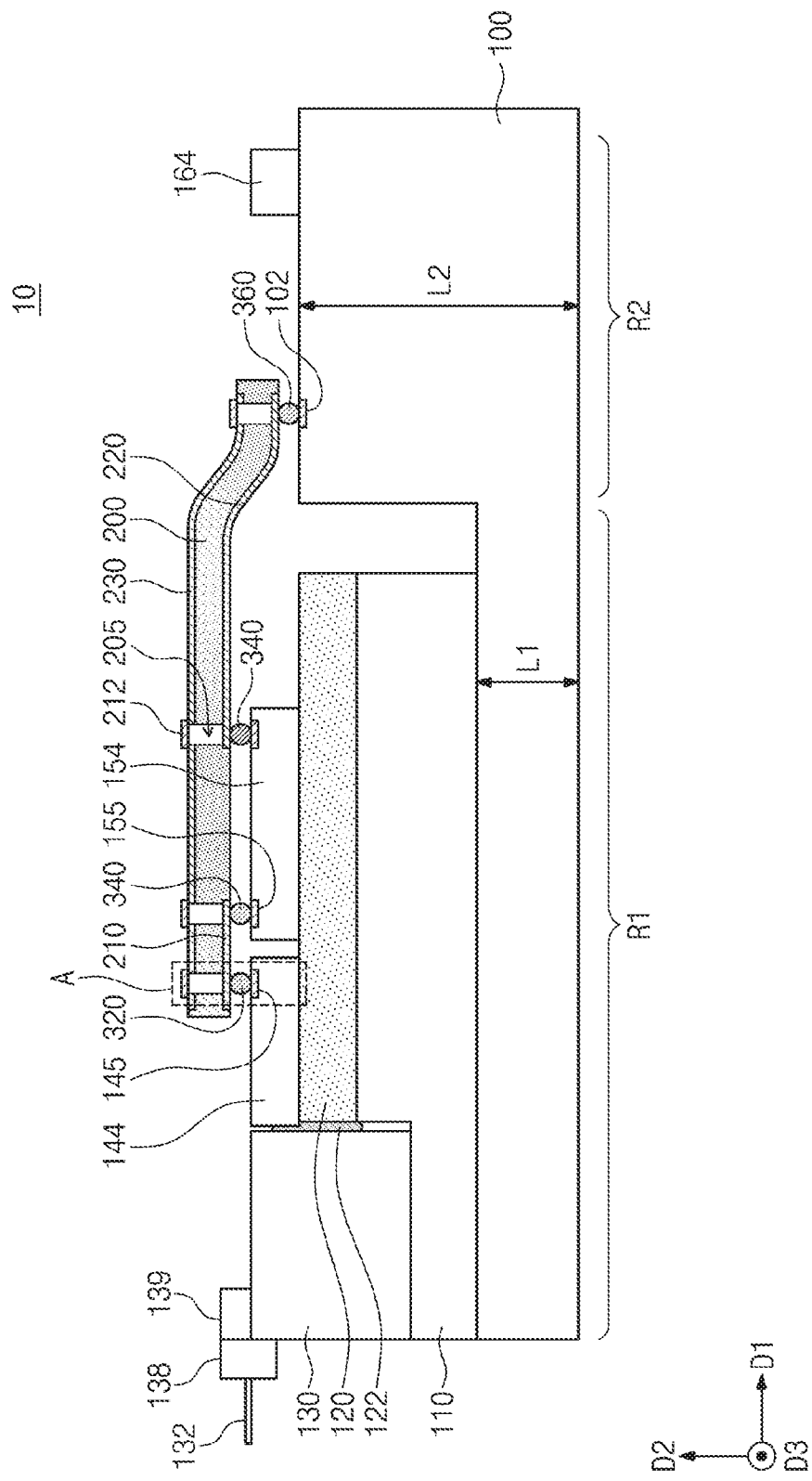
FIG. 2 shows the optical module of FIG. 1 viewed from one side surface.

FIG. 1 shows an optical module 10 according to an embodiment of the inventive concept. FIG. 2 shows the optical module 10 of FIG. 1 viewed from one side surface. The optical module 10 may be an optical module configured to transmit/receive multichannel lightwave. For example, the optical module 10 may be an optical module configured to transmit/receive 4 channel lightwaves, but is not limited thereto. Hereinafter, the optical module 10 according to an embodiment of the inventive concept will be described with reference to FIGS. 1 and 2. In the specification, in order to explain disposition and combination relationships between elements, a direction toward an optical transmission/reception unit 140 from an optical waveguide device 130 is defined as a first direction D1, a direction perpendicular to the first direction D1 is defined as a second direction D2, and a direction perpendicular to the first direction D1 and the second direction D2 is defined as a third direction D3.

The optical module 10 may include a carrier board 100, an optical bench 110, a submount 120, an optical waveguide device 130, an optical transmission/reception unit 140, an electronic IC 150, a flexible PCB 200, and a signal control unit 160. The carrier board 100 may be, for example, a printed circuit board. The carrier board 100 may be, for example, a printed circuit board for TRx or a line card. The carrier board 100 may have a first region R1 and a second region R2. On the first region R1 of the carrier board 100, the carrier board 100, the optical bench 110, the submount 120, the optical waveguide device 130, the optical transmission/reception unit 140, and the electronic IC 150 may be mounted. On the second region R2 of the carrier board 100, a signal control unit 160 may be mounted. The flexible PCB 200 may be disposed on the first region R1 and the second region R2. For example, a part of the flexible PCB 200 may be disposed on the first region R1, and the other part may be disposed on the second region R2. The level L1 of the first region R1 may be lower than the level L2 of the second region R2. However, this is just one example and is not limited thereto.

The optical bench 110 may be disposed on the first region R1 of the carrier board 100. The optical bench 110 may be, for example, a metal optical bench (MOB), but is not limited thereto. For example, the optical bench 110 may be a silicon optical bench. Unlike this, the optical bench 110 may be omitted, and the optical waveguide device 130 and the submount 120 may be mounted on the carrier board 100.

The optical waveguide device 130 may be disposed on the optical bench 110. Multiple channel lightwaves may be input to/output from the optical waveguide device 130. For example, 4 channel lightwaves may be input to/output from the optical waveguide device 130. The optical waveguide device 130 may include a Transmitter arrayed waveguide grating (Tx AWG) configured to multiplex the multiple channel lightwaves and a Receiver arrayed waveguide grating (Rx AWG) configured to demultiplex multi-channel lightwave. The Tx AWG and the Rx AWG may be provided in a single chip, but, unlike this, may be respectively provided in independent chips.

An optical fiber unit 132 and an optical fiber array block 138 may be provided to one side of the optical waveguide device 130. The optical fiber unit 132 and the optical fiber array block 138 may be coupled to the optical waveguide device 130. The optical fiber unit 132 may include a first optical fiber 134 and a second optical fiber 136. The second optical fiber 136 may transmit multi-channel/multi-wavelength lightwave to the optical waveguide device 130, and the first optical fiber 134 may transmit the multi-channel lightwaves from the optical waveguide device 130 to an external device (not shown). The optical fiber array block 138 may provide a coupling space for the optical fiber unit 132 and the optical waveguide device 130. The optical fiber array block 138 may further include a contact element (e.g., a glass lid 139) configured to broaden a contact area of the optical fiber unit 132 and the optical waveguide device 130.

The submount 120 may be disposed on the optical bench 110. The submount 120 may be disposed in one side of the optical waveguide device 130. For example, the optical waveguide device 130 and the submount 120 may be disposed along the first direction D1. The submount 120 may include, for example, silicon, but is not limited thereto. A bonding part 122 may be provided between the submount 120 and the optical waveguide device 130 to connect the submount 120 and the optical waveguide device 130. For example, the bonding part 122 may include a UV-epoxy.

The optical transmission/reception unit 140 and the electronic IC 150 may be disposed on the submount 120. Although not illustrated in the drawings, a contact element may be provided between the optical transmission/reception unit 140 and the submount 120, and between the electronic IC 150 and the submount 120.

The optical transmission/reception unit 140 may be disposed in one side of the optical waveguide device 130. The electronic IC 150 may be disposed in one side of the optical transmission/reception unit 140. For example, the optical waveguide device 130, the optical transmission/reception unit 140 and the electronic IC 150 may be disposed along the first direction D1.

The optical transmission/reception unit 140 may include an optical source device 142 and an optical detection device 144. The optical source device 142 and the optical detection device 144 may be separated in the second direction D2. For example, the optical source device 142 may be coupled with the Tx AWG of the optical waveguide device 130, and the optical detection device 144 may be coupled with the Rx AWG of the optical waveguide device 130. For example, the optical source device 142 may be chip-to-chip bonded with the Tx AWG of the optical waveguide device 130, and the optical detection device 144 may be chip-to-chip bonded with the Rx AWG of the optical waveguide device 130.

The optical source device 142 may include, for example, a direct modulated laser (DML). Alternatively, the optical source device 142 may include an electro-absorption modulated laser (EML). The optical source device 142 may be provided in a single chip or an array type. The optical detection device 144 may include, for example, a PIN-PD and/or an avalanche photodiode (APD).

The electronic IC 150 may include an optical source device driving unit 152 and a signal amplification unit 154. The optical source device driving unit 152 and the signal amplification unit 154 may be separated in the second direction D2. For example, the optical source device driving 152 may be electrically connected with the optical source device 142, and the signal amplification unit 154 may be electrically connected with the optical detection device 144.

The optical source device driving unit 152 may include a driver array configured to drive the optical source device 142, and the signal amplification unit 154 may amplify a photocurrent output received from the optical detection device 144. For example, the optical source device driving unit 152 may include a DML driver IC, and the signal amplification unit 154 may include a transimpedance amplifier array (TIA).

The signal control unit 160 may be disposed on the second region R2 of the carrier board 100. For example, the signal control unit 160 may include a first signal control unit 162 and a second signal control unit 164 separated in the second direction D2. The signal control unit 160 may control high frequency signals output from the optical transmission/reception unit 140 and/or the electronic IC 150. The first signal control unit 162 may be electrically connected to the optical source device driving unit 152, and the second signal control unit 164 may be electrically connected to the signal amplification unit 154.

The first signal control unit 162 may perform a Tx clock and data recovery (CDR) operation, and the second signal control unit 164 may perform an Rx CDR operation. The second region R2 of the carrier board 100 may include an additional transceiver (TRx). The second region R2 of the carrier board 100 may include a PCB for a line-card.

The flexible PCB 200 may be disposed on the optical transmission/reception unit 140, the electronic IC 150, and the carrier board 100. For example, a part of the flexible PCB 200 may vertically overlap the optical transmission/reception unit 140 and the electronic IC 150, and the other part of the flexible PCB 200 may vertically overlap the carrier board 100 of the second region R2. The flexible PCB 200 may be, for example, a flexible printed circuit board. The flexible PCB 200 may include a bulk dielectric such as polyimide or Teflon. For example, polyimide may have permittivity of about 3.0 to about 3.5, and Teflon may have permittivity of about 2.6 to about 3.0.

The flexible PCB 200 may include a first signal wiring 210, a second signal wiring 220, and a ground wiring 230. The first signal wiring 210 may be a wiring between a first solder ball 320 and a second solder ball 340, and the second signal wiring 220 may be a wiring between the second solder ball 340 and a third solder ball 360. The first signal wiring 210 may electrically connect the first solder ball 320 and the second solder ball 340, and the second signal wiring 220 may electrically connect the second solder ball 340 and the third solder ball 360. The ground wiring 230 may be a ground wiring for impedance matching of a signal. For example, a ground voltage may be applied to the ground wiring 230. The ground wiring 230 may be provided to a ground layer (not shown) separated from the first signal wiring 210 and the second signal wiring 220.

The first to third solder balls 320, 340, and 360 may electrically connect the flexible PCB 200 with each of the optical transmission/reception unit 140, the electronic IC 150, and the carrier board 100. The first to third solder balls 320, 340, and 360 may have an identical or similar configuration to each other, but, in this specification, descriptions thereabout will be provided for each of them in order to simply explain coupling relationships between the elements. The first to third solder balls 320, 340, and 360 may include InPb, AgSnCu, PbSn, AuSn or the like.

The first solder balls 320 may be disposed between the flexible PCB 200 and the optical transmission/reception unit 140. Each of the first solder balls 320 may electrically connect the flexible PCB 200 and the optical transmission/reception unit 140. Each of the first solder balls 320 may electrically connect the first signal wiring 210 of the flexible PCB 200 and a conductive pad of the optical transmission/reception unit 140. The first solder balls 320 may electrically connect the flexible PCB 200 with the optical source device 142, and the flexible PCB 200 with the optical detection device 144. For example, as shown in FIG. 2, the first solder ball 320 may electrically connect the first signal wiring 210 of the flexible PCB 200 and a first conductive pad 145 of the optical transmission/reception unit 140. Although not shown in the drawing, each of the optical source device 142 and the optical detection device 144 may include an internal wiring (not shown) for electrical connection between the electronic IC 150 and the flexible PCB 200.

The second solder balls 340 may be disposed between the flexible PCB 200 and the electronic IC 150. Each of the second solder balls 340 may electrically connect the flexible PCB 200 and the electronic IC 150. The second solder balls 340 may electrically connect the flexible PCB 200 with the optical source device driving unit 152, and the flexible PCB 200 with the signal amplification unit 154. Each of the second solder balls 340 may electrically connect the first signal wiring 210 of the flexible PCB 200 with a conductive pad of the electronic IC 150, and the second signal wiring 220 of the flexible PCB 200 with the conductive pad of the electronic IC 150. For example, as shown in FIG. 2, the second solder ball 340 may electrically connect the first signal wiring 210 of the flexible PCB 200 with a second conductive pad 155 of the signal amplification unit 154, and the second signal wiring 220 of the flexible PCB 200 with a second conductive pad 155 of the signal amplification unit 154. Although not shown in the drawing, each of the optical source device driving unit 152 and the signal amplification unit 154 may include internal wirings (not shown) for electrical connection between the optical source device 142 and the flexible PCB 200, and between the optical detection device 144 and the flexible PCB 200.

The third solder balls 360 may be disposed between the flexible PCB 200 and the carrier board 100 of the second region R2. Each of the third solder balls 360 may electrically connect the flexible PCB 200 and the carrier board 100 of the second region R2. Each of the third solder balls 360 may electrically connect the second signal wiring 220 of the flexible PCB 200 and a conductive pad of the carrier board 100 of the second region R2. For example, as shown in FIG. 2, the third solder ball 360 may electrically connect the second signal wiring 220 of the flexible PCB 200 and a third conductive pad 102 of the carrier board 102 of the second region R2. Although not shown in the drawing, the carrier board 100 may include an internal wiring (not shown) for electrical connection between the third pad 102 and the signal control unit 160.

Figure 3:
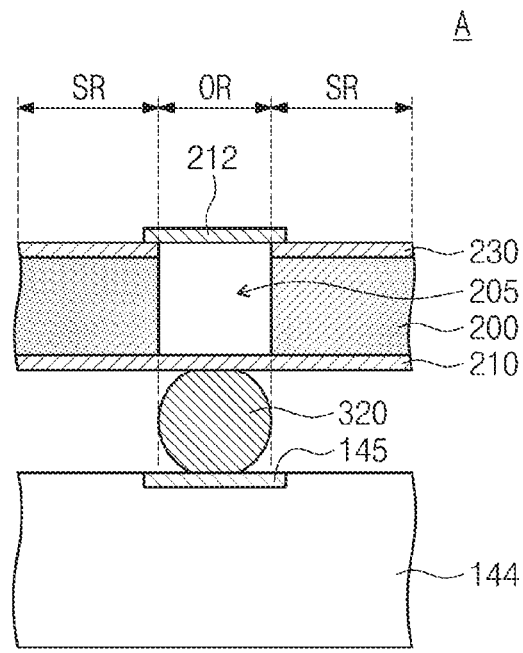
FIG. 3 is an enlarged view of A in FIG. 2 according to an embodiment of the inventive concept.

FIG. 3 is an enlarged view of A in FIG. 2 according to an embodiment of the inventive concept. Referring to FIG. 3, the flexible PCB 200 may include an overlap region OR and a separation region SR. The overlap region OR is one region vertically overlapping the first solder ball 320, and the separation region SR may be the remaining region excluding the overlap region OR. The separation region SR may be a region horizontally separated from the first solder ball.

The flexible PCB 200 may have an air hole 205, air gap, via hole, or empty space. The air hole 205 may be provided in the overlap region OR of the flexible PCB 200. An atmospheric air may be filled in the air hole 205. For example, the atmospheric air may include $N_2$ gas. The flexible PCB 200 may further include a cover pad 212 configured to cover the air hole 205. The air hole 205 may be an air gap between the cover pad 212 and the first signal wiring 210. The cover pad 212 may include, for example, gold (Au), but is not limited thereto. The cover pad 212 may be electrically connected to the ground wiring 230.

Since the air hole 205 includes the atmospheric air, the overlap region OR may secure the permittivity lower than that of the flexible PCB 200 in the separation region SR. Accordingly, a capacitance of the first signal wiring 210 of the overlap region OR may be further locally reduced. The air hole 205 of the first signal wiring 210 may have the diameter corresponding to or greater than that of the first solder ball 320. If necessary, the depth (e.g., the distance from the ground wiring 230 toward the first signal wiring 210) of the air hole 205 may be controlled.

Typically, as the flexible PCB 200 contacts the optical transmission/reception unit 140, the electronic IC 150, and the carrier board 100 of the second region R2 due to the first to third solder balls 320, 340 and 360, the capacitance may increase in proportion to the volume of the first to third solder balls 320, 340 and 360. Accordingly, at portions in which the first to third solder balls 320, 340 and 360 are provided, an impedance of the flexible PCB 200 may increase locally. In other words, impedance mismatching may occur in one portion of the flexible PCB 200. However, according to an embodiment of the inventive concept, the capacitance in the overlap region OR is locally reduced so as to reduce the impedance mismatching and achieve impedance matching.

FIG. 3 mainly illustrates the first solder ball 320 that electrically connects the optical transmission/reception unit 140 with the flexible PCB 200, but it is clear that such a solder ball bonding structure is applied to the second solder ball 340 and the third solder ball 360.

According to the idea of the inventive concept, the flexible PCB 200 may be electrically coupled to each of the optical transmission/reception unit 140, the electronic IC 150, and the carrier board 100 of the second region R2 through the solder balls 320, 340 and 360. Accordingly, wirings for electrical couplings may be omitted between the flexible PCB 200 and the optical transmission/reception unit 140, between the flexible PCB 200 and the electronic IC 150, and between the flexible PCB 200 and the carrier board 100 of the second region R2. Because of this, an electrical wiring structure may be provided through which the flexible PCB is directly connected with the elements, which may result in that a signal delivery path of the optical module 10 may be reduced. The optical module 10 may function as a multi-channel high speed optical transmission/reception module in which each channel is multi-level modulated at 50/100 Gbps or higher. In addition, the solder ball contact structure may be provided which may reduce the local impedance mismatching through couplings of each of the solder balls 320, 340, and 360. Accordingly, the impedance of the flexible PCB 200 may be controlled to be matched.

Figure 4:
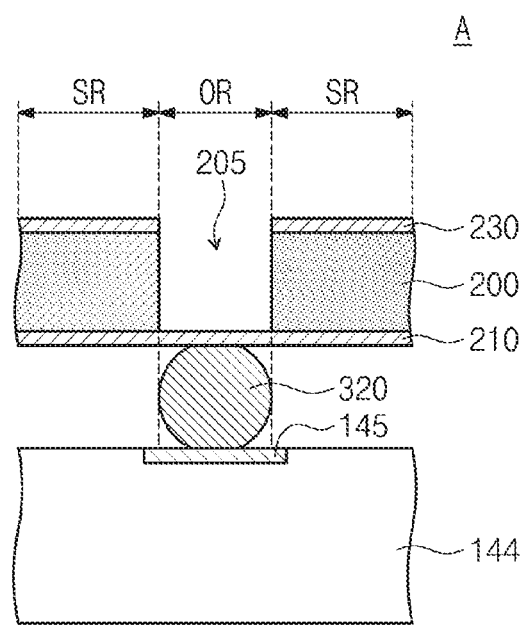
FIG. 4 is an enlarged view of A in FIG. 2 according to an embodiment of the inventive concept.

FIG. 4 illustrates a solder ball contact structure according to an embodiment of the inventive concept, which is an enlarged view of A in FIG. 2. Referring to FIG. 4, the flexible PCB 200 may include an overlap region OR and a separation region SR. The overlap region OR is one region vertically overlapping the first solder ball 320, and the separation region SR may be the remaining region excluding the overlap region OR. The separation region SR may be a region horizontally separated from the first solder ball 320.

The flexible PCB 200 may have an air hole 205, air gap, via hole, or empty space. The air hole 205 may be provided in the overlap region OR of the flexible PCB 200. The air hole 205 may include the air. The air hole 205 may expose a part of the first signal wiring 210. The air hole 205 may expose the first signal wiring 210 in one region vertically overlapped with the first solder ball 320.

Since the air hole 205 includes the air, the overlap region OR may secure the permittivity lower than that of the flexible PCB 200 in the separation region SR. Accordingly, a capacitance of the first signal wiring 210 in the overlap region OR may be further reduced locally. A part of the ground wiring 230 is removed to further reduce a capacitance in a region in which the first solder ball 320 is provided, and thus the impedance may further increase.

Figure 5:
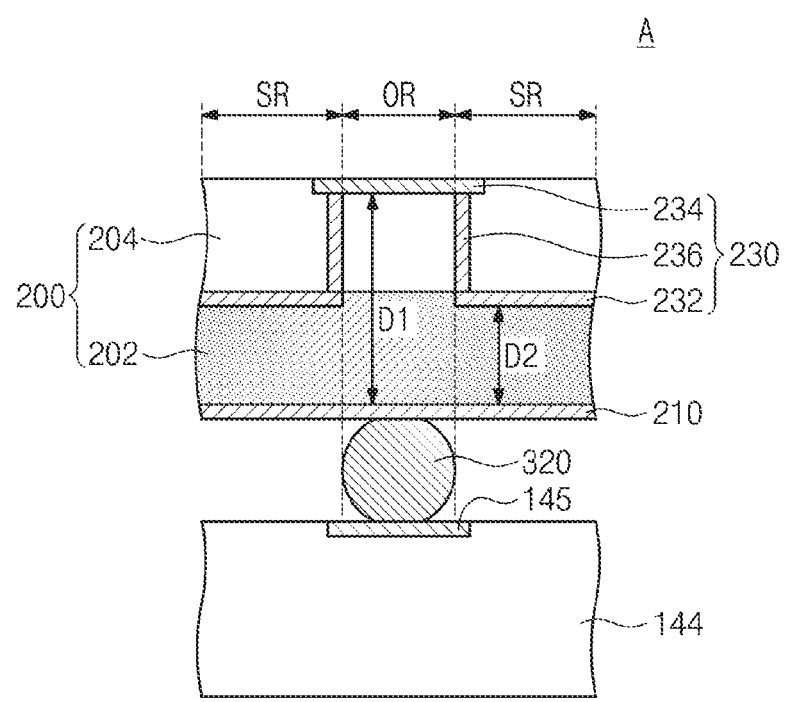
FIG. 5 is an enlarged view of A in FIG. 2 according to an embodiment of the inventive concept.

FIG. 5 illustrates a solder ball contact structure according to an embodiment of the inventive concept, which is an enlarged view of A in FIG. 2. Referring to FIG. 5, the flexible PCB 200 may include an overlap region OR and a separation region SR. The overlap region OR is one region vertically overlapping the first solder ball 320, and the separation region SR may be the remaining region excluding the overlap region OR. The separation region SR may be a region horizontally separated from the first solder ball 320.

The flexible PCB 200 may include a first layer 202 and a second layer 204. The first layer 202 and the second layer 204 may be sequentially laminated on the first signal wiring 210. The second layer 204 may include a material having a lower permittivity than the first layer 202. For example, the first layer 202 may include polyimide, and the second layer may include Teflon. However, this is just an example, and the embodiment is not limited thereto.

The ground wiring 230 may include a first ground wiring 232, a second ground wiring 234, and contacts 236. The first ground wiring 232 may be provided to the first layer 202, and the second ground wiring 234 may be provided to the second layer 204. The first ground wiring 232 may be vertically overlapped with the separation region SR, and the second ground wiring 234 may be vertically overlapped with the overlap region OR. Each of the contacts 236 may electrically connect the first ground wiring 232 and the second ground wiring 234. Unlike the illustrated, the contacts 236 may be provided in a via structure in which a metal is deposited on the side surfaces and the inside thereof is empty. In this case, the contacts 236 may be formed by forming and patterning the second layer 204 to provide the via, and then by plating the metal on the side surfaces.

Accordingly, the distance between the first signal wiring 210 and the second ground wiring 234 in the overlap region OR is larger than the distance between the first signal wiring 210 and the first ground wiring 232 in the separation region SR. Accordingly, the capacitance of the first signal wiring 210 in the overlap region OR may be more reduced locally. Accordingly, the impedance, which has been reduced by the first solder ball 320, may be controlled and matched.

Up to now, an optical transmission/reception module has been explained as an example of the optical module 10, but the optical module 10 may also be utilized as a transmitter optical sub-assembly (TOSA) or a receiver optical sub-assembly (ROSA). In addition, in FIG. 2, a case where all the bonding structures of the first to third solder balls 320, 340 and 360 are the same is explained as an example, but only at least some of them may have the structures of FIGS. 3 to 5. In addition, the first to third solder balls 320, 340 and 360 may selectively have the structures of FIGS. 3 to 5. Furthermore, the first to third solder balls 320, 340 and 360 are not only provided between each component and the flexible PCB 200, but are also applied to each component and a submount or an interposer board, if necessary.

According to the embodiments of the inventive concept, the flexible PCB may be electrically coupled with each of the optical transmission/reception unit, the electrical element IC, and the carrier board through the solder balls. Accordingly, wirings for very high speed electrical coupling may be omitted between the flexible PCB and each of the optical transmission/reception unit, the electrical element IC, and the carrier board. Because of this, an electrical wiring structure may be provided through which the flexible PCB is directly connected with the elements, which may result in that a signal delivery path of an optical module is reduced. In addition, instead of Au (gold) wire bondings causing large impedance mismatching, the flexible PCB in which impedance is controlled and matched may be used to improve impedance mismatching at each connection part (e.g., a solder ball structure) and to maximize the high frequency characteristics. Such an optical module may function as a multi-channel high speed optical transmission/reception module in which each channel is multi-level modulated at 50/100 Gbps or higher. In addition, a solder ball contact structure may be provided which may reduce the local impedance mismatching due to coupling of each solder ball. Accordingly, the impedance may be controlled to be matched in each local area connected to the flexible PCB.

Although the exemplary embodiments of the present invention have been described, it is understood that the present invention may be implemented as other concrete forms without changing the inventive concept or essential features. Therefore, these embodiments as described above are only proposed for illustrative purposes and do not limit the present disclosure.

What is claimed is:

1. An optical module comprising:
   an optical waveguide device through which multiple channel lightwaves are input and output;
   an optical transmission/reception unit disposed on one side of the optical waveguide device;
   an electronic IC disposed on one side of the optical transmission/reception unit and configured to drive the optical transmission/reception unit;
   a flexible printed circuit board (PCB) disposed on the optical transmission/reception unit and the electronic IC;
   a first solder ball disposed between the optical transmission/reception unit and the flexible PCB; and
   a second solder ball disposed between the electronic IC and the flexible PCB;
   wherein the flexible PCB comprises a first signal wiring between the first solder ball and the second solder ball;
   wherein the flexible PCB further comprises an air hole vertically overlapping at least one of the first solder ball and the second solder ball; and
   wherein the first signal wiring contacts at least one of the first solder ball and the second solder ball, and
   the air hole exposes at least a part of the first signal wiring.

2. The optical module of claim 1, wherein the first signal wiring contacts at least one of the first solder ball and the second solder ball, and
   the optical module further comprises a cover pad separated from the first signal wiring and configured to cover the air hole.

3. The optical module of claim 1, further comprising:
   a ground wiring,
   wherein the flexible PCB comprises an overlap region vertically overlapping the first solder ball and a separation region separated horizontally from the first solder ball, and
   wherein a distance between the first signal wiring in the overlap region and the ground wiring is larger than a distance between the first signal wiring in the separation region and the ground wiring.

4. The optical module of claim 3, wherein the flexible PCB comprises a first layer and a second layer sequentially laminated on the first signal wiring, and
   the ground wiring comprises:
   a first ground wiring disposed on the first layer of the overlap region;

a second ground wiring disposed on the second layer in the separation region; and a contact configured to connect the first and second ground wirings.

5. The optical module of claim 1, further comprising:

a submount on which the optical transmission/reception unit and the electronic IC are mounted.

6. The optical module of claim 5, further comprising:

a carrier board on which the optical waveguide device and the submount are mounted, wherein the carrier board comprises a first region in which the optical waveguide device and the submount are mounted, and a second region in which a signal control unit is comprised which controls high frequency signals output from the optical transmission/reception unit.

7. The optical module of claim 6, further comprising:

a third solder ball between the second region and the flexible PCB.

8. The optical module of claim 7, wherein the flexible PCB comprises a second signal wiring between the second solder ball and the third solder ball.

9. The optical module of claim 1, wherein the optical waveguide device comprises:

a transmitter arrayed waveguide grating (Tx AWG) configured to multiplex the multiple channel lightwaves and transmit multi-channel lightwaves; and a receiver arrayed waveguide grating (Rx AWG) configured to receive and demultiplex the multi-channel lightwaves.

10. The optical module of claim 1, wherein the optical waveguide device, the optical transmission/reception unit and the electronic IC are disposed along a first direction.

11. The optical module of claim 10, wherein the optical transmission/reception unit comprises an optical source device and an optical detection device, wherein the optical source device and the optical detection device are separated in a second direction perpendicular to the first direction.

12. The optical module of claim 11, wherein the electronic IC further comprises:

an optical source device driving unit configured to drive the optical source device; and a signal amplification unit configured to amplify a signal output from the optical detection device, wherein the optical source device driving unit and the signal amplification unit are separated in the second direction.

13. A solder ball bonding structure comprising:

a first device comprising a first signal wiring and a signal ground unit;

a second device comprising a conductive pad; and a solder ball configured to connect the first signal wiring and the conductive pad, wherein the first device comprises an air hole vertically overlapped with the solder ball, and wherein the first device further comprises a cover pad vertically overlapped with the solder ball, and configured to cover the air hole.

14. The optical module of claim 13, wherein a diameter of the air hole corresponds to or is greater than a diameter of the solder ball.

15. A solder ball bonding structure comprising:

a first device comprising a first signal wiring and a signal ground unit;

a second device comprising a conductive pad; and a solder ball configured to connect the first signal wiring and the conductive pad, wherein the first device comprises an air hole vertically overlapped with the solder ball, and wherein the air hole exposes at least a part of the first signal wiring vertically overlapped with the solder ball.

* * * * *